United States Patent [19]

Oliver, Jr. et al.

[11] Patent Number: 4,977,371
[45] Date of Patent: Dec. 11, 1990

[54] VARIABLE FREQUENCY I-V MEASUREMENT SYSTEM

[75] Inventors: James D. Oliver, Jr., Belle Mead; Kenneth A. Biles, Union; Dumrong Kasemset, Hopewell, all of N.J.

[73] Assignee: Siemens Aktiengesellschaft, Berlin and Munich, Fed. Rep. of Germany

[21] Appl. No.: 294,240

[22] Filed: Jan. 6, 1989

[51] Int. Cl.⁵ .................. G01R 31/26; G01R 31/28
[52] U.S. Cl. ............................. 324/158 T; 324/73.1
[58] Field of Search ............ 324/158 T, 158 D, 73 R, 324/73.1, 158 R

[56] References Cited

U.S. PATENT DOCUMENTS 2,577,803 12/1951 Pfann ........................... 324/158 T
2,663,829 12/1952 Brattain ....................... 324/158 T
2,666,977 1/1954 Pfann ........................... 324/158 T

OTHER PUBLICATIONS

Miller et al,; "Mechanisms . . . ", IEEE Transactions on Electron Device, vol. ED-34; No. 6; Jun. 1987; 1239-1244.
Li, J.; Semicond. Sci. Technol. 2 (1987); 337-339.
Bauhaus, R. H.; "Measuring . . . ", Hewlett-Packard Journal; Jan. 1969; vol. 20; No. 5; pp. 11-14.
Solid-State Electronics, vol. 29, No. 10, pp. 1087-1097, 1986, entitled "Analysis of Capacitance & Transconductance Frequency Dispersions in Mesfets for Surface Char.".
IEEE Transactions on Electron Devices, vol. ED-27, No. 6, Jun. 1980, pp. 1013-1018, entitled "Control of Gate-Drain Avalanche in GaAs Mesfet's ", (S. Wemple).
IEEE Transactions on Electron Devices, vol. ED-33, No. 10, Oct. 1986, pp. 1447-1453, entitled "Surface Influence on the Conductance DLTS Spectra of GaAs Mesfet's".
GEC Journal of Research, vol. 5, No. 4, 1987, pp. 217-225, entitled "Low-Field Low-Frequency Dispersion of Transconductance in GaAs Mesfets" (P. H. Ladbrooke et al.).

*Primary Examiner*—Ernest F. Karlsen
*Attorney, Agent, or Firm*—Jeffrey P. Morris; John F. Moran; Eugene S. Indyk

[57] ABSTRACT

A variable-frequency I-V measurement system for testing the IC device, such as a GaAs MESFET, has probes for measuring the bias voltage, drain voltage, drain current, and gate signal voltage, a gate signal source, and a computer controller for controlling the gate signal source to provide, in sequence, gate signals varied in waveform, voltage, and frequency, in order to measure the I-V characteristics of the device in response to variable frequency gate signals. Values for maximum drain current (Imax) and percentage drop in Imax at different frquencies are derived and used to predict the RF performance characteristics of the device and to select good wafers early in the fabrication process, as well as for non-destructive testing of frequency dispersion effects on the device. For GaAs MESFET C-band devices fabricated with epitaxial layers, a single gate, and a surface passivation layer, a percentage drop in Imax of about 12-15% or less, measured at 10 Hz and 1 MHZ gate signal frequencies, are correlated to good levels of RF power output and efficiency.

20 Claims, 10 Drawing Sheets

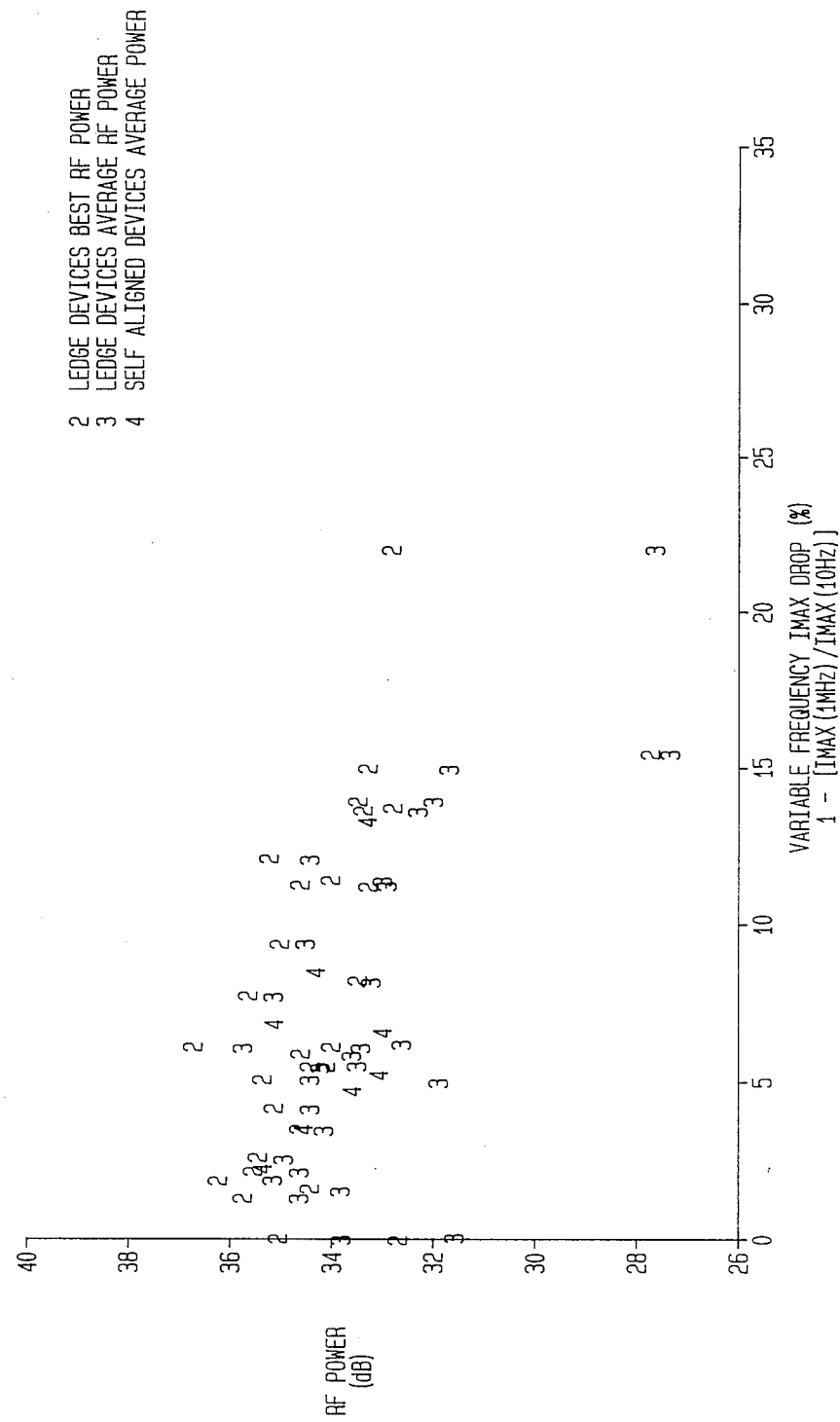

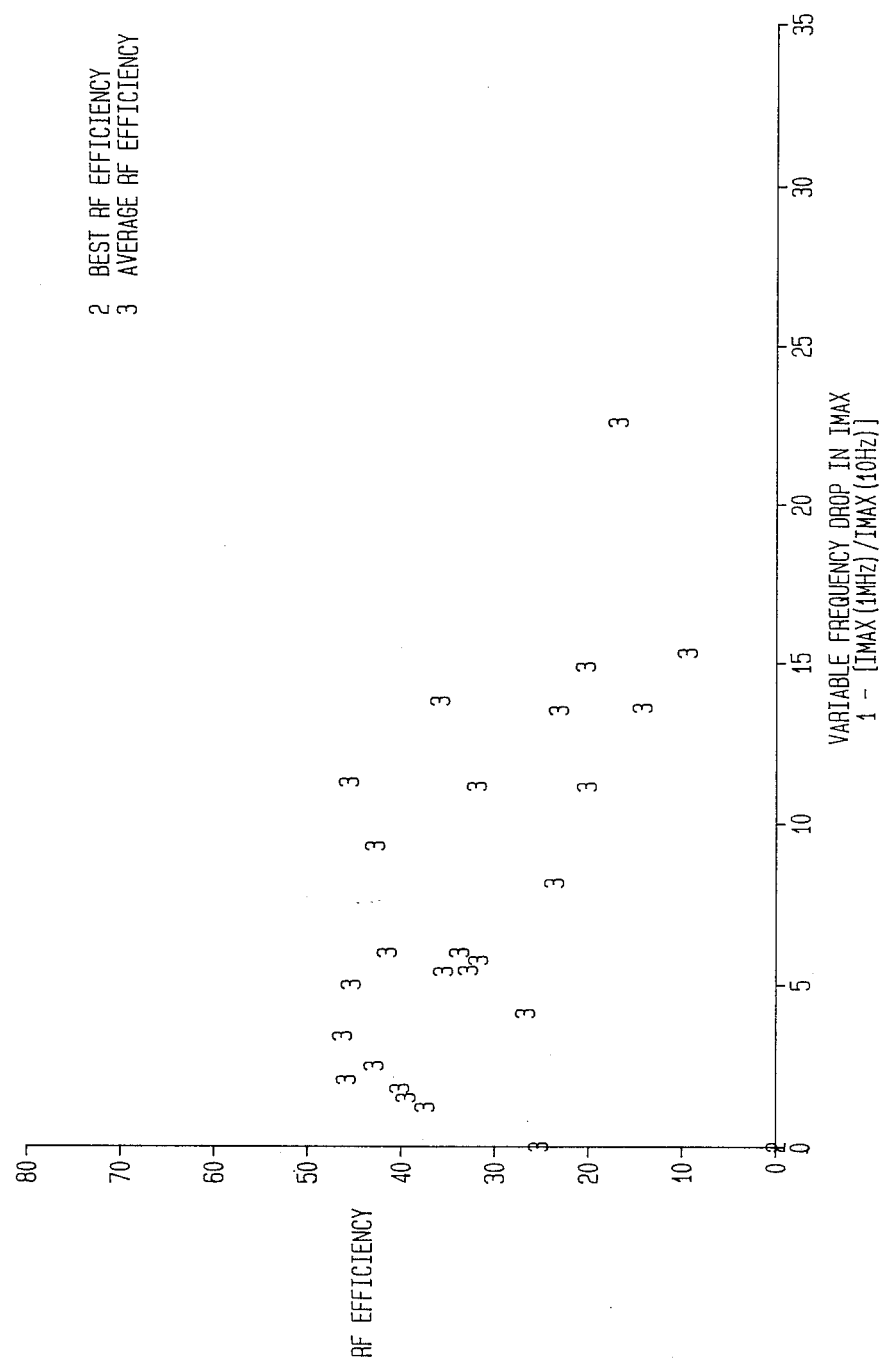

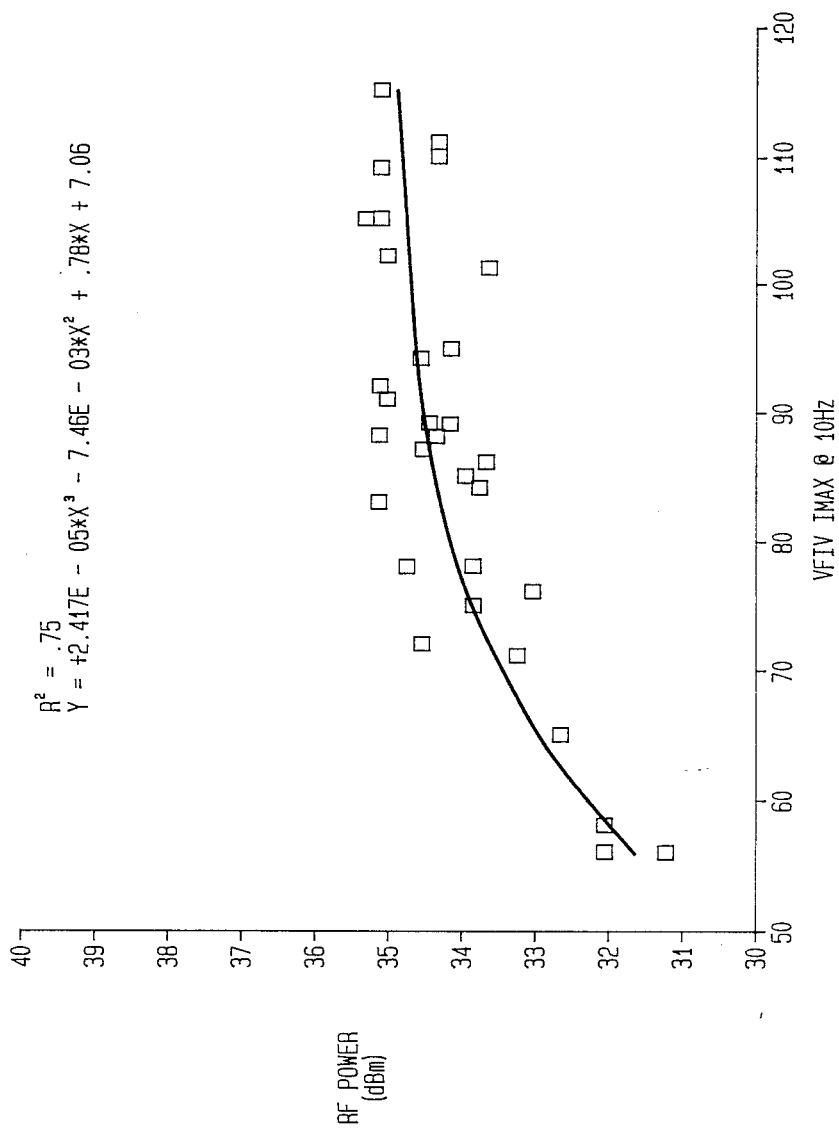

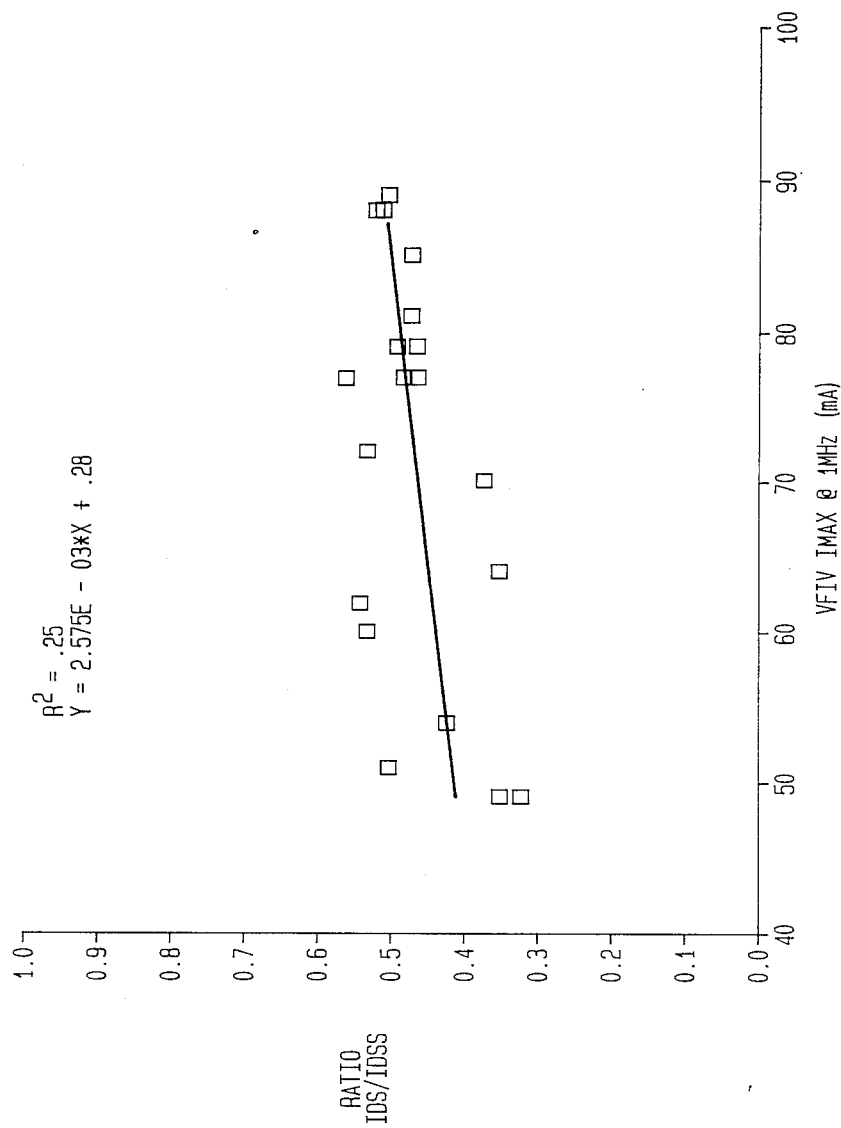

VARIABLE FREQUENCY I-V MEASUREMENT SYSTEM

FIELD OF INVENTION

The present invention relates to a system for measuring the current-voltage (I-V) characteristics of an IC device, and particularly, to a variable frequency I-V measurement system which can be used to test and predictively select IC devices which are likely to exhibit good RF power and efficiency characteristics in actual use.

BACKGROUND OF INVENTION

The performance of IC devices for microwave frequencies has often not been as good as indicated by device specifications using standard DC current-voltage measurements. In the case of GaAs metal-semiconductor field-effect transistors (MESFETs), the device performance exhibits frequency dispersion in low frequency ranges (below a few MHz) which is associated with detrimental effects on its electrical characteristics, such as drain current drift, looping of current-voltage characteristics, degradation of output power, gate leakage current increase, frequency dependence of the gate input admittance, and other anomalies.

Recent research on the I-V characteristics of MESFETs have noted the problems of frequency dispersion due to charge trapping effects in the surface access regions of the device, instead of to deep level trapping in the active layer-substrate interface, as previously thought. See, e.g., "Surface Influence On The Conductance Of DLTS Spectra Of GaAs MESFET's", by Stephen Blight, et al., IEEE Transactions On Electron Devices, Vol. ED-33, No. 10, October 1986; "Analysis Of Capacitance And Transconductance Frequency Dispersions in MESFETs for Surface Characterization", by J. Graffeuil, et al., Solid-State Electronics, Vol. 29, No. 10, pp. 1087-1097, 1986 (published in Great Britain); "Frequency Domain Detection of Deep Levels in GaAs MESFETS", by Jian-ren Li, Semiconductor Science and Technology 2, pages 337-339, January 1987 (published in the UK); and "Mechanisms For Low-Frequency Oscillations In GaAs FET's", by Daniel Miller, et al., IEEE Transactions On Electron Devices, Vol. ED-34, No. 6, June 1987.

As a result, various structures have been proposed to measure the effects of frequency dispersion on transconductance and other I-V characteristics of GaAs MESFETs. Also, alternative designs have been proposed attempting to reduce the frequency dispersion effects, including the use of passivating layers, large gate width to source-drain length ratios, buried channels, and notched gates.

In view of the prior work, it would be extremely useful to have an early indication whether or not a particular design or a sample of an IC device will have acceptable performance characteristics in contrast to unacceptable designs or nonconforming units. In the production process, IC devices are formed on wafers and subjected to successive forming and treatment steps to yield the final, packaged product. Since some of the wafers, as fabricated, will not meet the desired performance criteria, a predictive testing system would allow selection of the good wafers early in the production process, in order to increase production yields and avoid the time and expense of finishing, backend processing, packaging, and final testing of nonconforming wafers. Also, in the design and development of IC device structures, a predictive testing capability would allow performance characteristics to be conveniently assessed and compared for experimentation prior to final fabrication.

SUMMARY OF INVENTION

It is, therefore, a principal object of the invention to provide a method, and a system, for performing non-destructive testing of IC devices, and predictively determining whether the IC device is likely to have certain desired performance characteristics. The testing would utilize measurements which are conveniently taken in the early stages of design or the production process. It is a further object to provide a predictive testing system which is computerized to facilitate taking the test measurements, and to quickly perform the calculations needed to determine whether the tested IC devices are likely to meet the required performance criteria for final products.

In particular, the invention seeks specifically to provide a predictive testing system for GaAs MESFETs to test and select those units which are likely to exhibit good RF power output and efficiency in actual use, without degradation due to frequency dispersion, based upon measurement of their I-V characteristics.

In accordance with the invention, a variable-frequency I-V measurement system, for testing an IC device having source, drain, and gate terminals, comprises: a DC power supply for providing a bias voltage across the drain and source terminals of the IC device; measuring means for measuring at least a voltage developed at, and a current flowing through, the drain terminal in response to an input gate signal applied to the gate terminal, wherein the voltage and current measured by said measuring means represent an I-V characteristic of the IC device; a gate signal source for providing an input gate signal having a variable frequency to the gate terminal; and controller means for controlling said gate signal source to provide separately, in sequence, at least two input gate signals of different frequencies in a selected range of frequencies, for operating said measuring means to measure the I-V characteristics of the device in response to each of the two input gate signals, and for deriving a variable-frequency I-V (VFIV) value from the measured I-V characteristics of the device for each of the at least two input gate signals.

The invention also includes the method of comparing whether or not a difference in the derived VFIV values for the two or more gate signal frequencies meets a predetermined threshold level, said threshold level being selected to predict whether or not the IC device is likely to provide a selected performance characteristic in actual use. The invention also encompasses the related methods of using the VFIV measurement system for non-destructive testing of frequency-dependent effects on the IC device, and for computerized testing and predictive selection of manufactured wafers and chips to meet selected performance criteria.

In the preferred system of the invention, the VFIV measurement system is used to measure the percentage change in maximum source-drain current (Imax) at two or more gate signal frequencies, and correlates a percentage change below a predetermined threshold level to the likelihood that the IC device will have the performance characteristics of good RF power output and efficiency without degradation due to frequency dispersion. For GaAs MESFET C-band devices fabricated with epitaxial layers, a single gate, and a surface passivation layer, a percentage drop in Imax of about 12–15% or less, measured at 10 Hz and 1 MHz gate signal frequencies, are correlated to good levels of RF power output and efficiency.

BRIEF DESCRIPTION OF DRAWINGS

The above objects and further features and advantages of the invention are described in detail below in conjunction with the drawings, of which:

FIG. 5 is a scatter plot of average RF power measured for samples of the GaAs MESFET device against percentage VFIV Imax drop;

FIG. 6 is a scatter plot of RF power efficiency against percentage VFIV Imax drop;

FIG. 7 is a scatter plot of average RF power for samples of the GaAs MESFET device at 10 Hz as a function of VFIV Imax;

FIG. 10 is a scatter plot of the current linearity for samples of the GaAs MESFET device as a function of VFIV Imax at 1 MHz.

DETAILED DESCRIPTION OF INVENTION

The invention encompasses a measurement system and related methods for performing non-destructive test measurements of the current-voltage (I-V) characteristics of an IC device over a range of gate signal frequencies, and predictively determining whether the IC device will have desired performance characteristics based upon comparisons of the variable frequency I-V or "VFIV" values derived from the measured I-V data. The system is capable of taking measurements on wafers or on packaged devices, and of being computer-automated to facilitate convenient testing in incremental steps over given frequency, voltage, and current ranges.

Analyses and comparisons of the derived VFIV values with actual performance characteristics of the resulting IC devices, such as average power output and efficiency, show that certain VFIV values can be used to predictively select those devices which are likely to have the desired performance characteristics. The predictive selection of IC devices in wafer form allows savings of time and expense by avoiding the time-consuming process of finishing, backside processing, packaging, and RF testing of nonconforming wafers. The system can also be used to investigate frequency dependent effects of IC devices in wafer form or on test chips.

In the following description, examples of an IC predictive testing system and related methods in accordance with the invention are specifically applied to selecting GaAs MESFET devices likely to have good RF power performance characteristics. The devices tested include C-band MESFET devices fabricated with epitaxial or implanted layers, ledge-type or self-aligned gates, and with or without surface passivation layers. However, the principles of the invention are deemed to be equally applicable to other types of semiconductor devices, testing environments and performance criteria.

Figure 1:
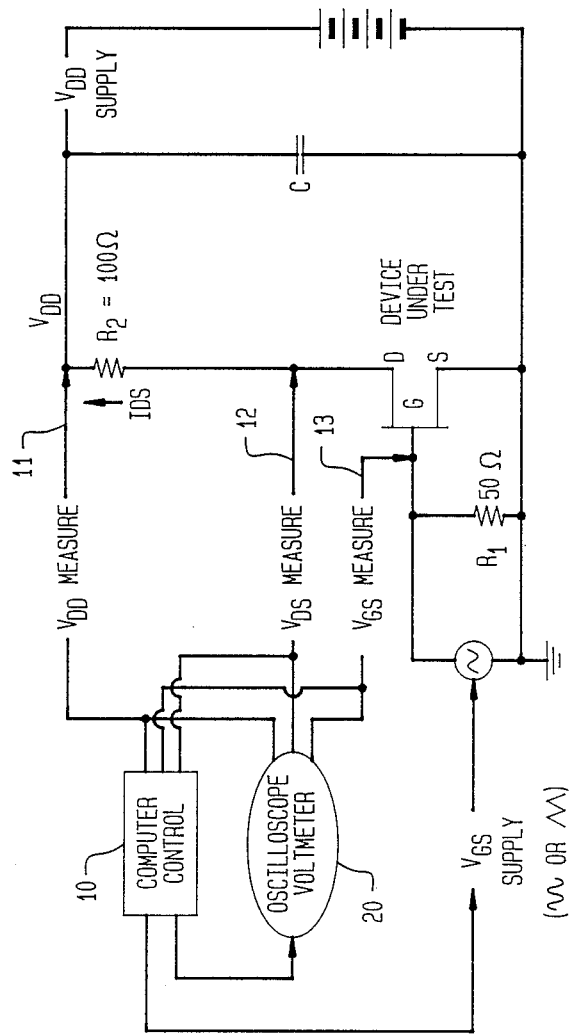
FIG. 1 is a schematic diagram of a variable-frequency, current-voltage (VFIV) measurement system in accordance with the invention.

Referring to FIG. 1, an automated VFIV measurement system is shown having a DC supply source to supply a bias voltage "Vdd", a resistor R2 connected in series between the DC supply source and the drain terminal "d" of a power FET device, a capacitor C connected in parallel therewith, and the source terminal "s" of the device connected in common to ground. The gate terminal "g". of the device is connected to a signal source for the gate signal "Vgs", and a resistor R1 is connected in parallel therewith for impedance matching. A computer controller 10 is used to control all functions of the measurement system. A voltage supply probe 11 is used to measure the bias voltage Vdd, a drain probe 12 tests the voltage "Vds" at the drain terminal, a gate probe 13 tests the gate signal "Vgs" at the gate terminal, and a ground probe is connected to the source terminal in order to take the respective voltage measurements. The R2 resistor is provided for monitoring the drain current "Ids" through the voltage drop from Vdd to Vds. A digital oscilloscope and a digital voltmeter, collectively indicated by reference numeral 20, are used to provide a display and readout of the test measurements.

Figure 2A:
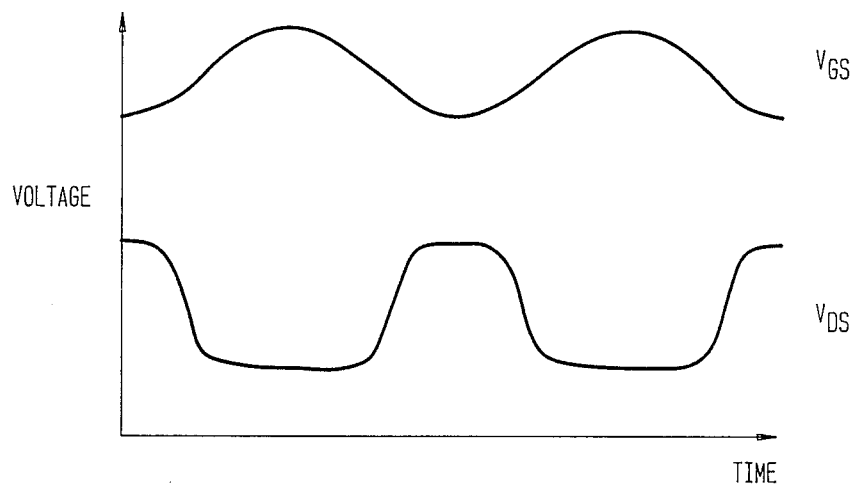
FIGS. 2a and 2b show sample oscilloscope displays for I-V characteristics of a GaAs MESFET device tested with sinusoidal and sawtooth gate signals, respectively, for the system of FIG. 1.
Figure 2B:
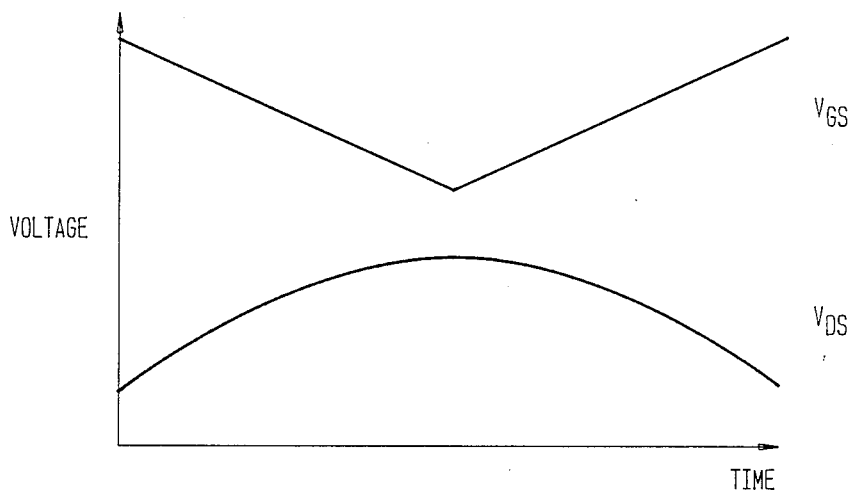

In one implementation of the measurement system, the computer controller 10 is a Hewlett-Packard Model 310 computer with an HPIB (IEEE-488) interface. An Alessi manual wafer probe station is used having the four probes. The gate signal source Vgs is a function generator which generates sine waves or sawtooth waves over a range of frequencies from 0.5 Hz to 6 MHz as controlled by the computer controller 10. Other signal functions may also be used, e.g., pulse, square, or continuous waveforms. The gate signal is also controlled by the computer controller 10 to vary from a pinchoff potential (Vp) to a forward bias 1.2 volt potential relative to the source terminal. The digital oscilloscope is used to measure the drain voltage Vds and the gate voltage Vgs, and the digital voltmeter is used to measure the bias voltage Vdd. The oscilloscope display for gate signal Vgs as sine waves at 10 Hz and Vds is shown in FIG. 2a, and for Vgs as sawtooth waves at 100 Hz and Vds in FIG. 2b.

To increase measurement accuracy and reduce circuit oscillations, a number of modifications are made to the testing system. The gate probe is modified by placing the R1 resistor of 50 ohms in parallel with the probe tip to ensure proper impedance matching with the gate signal function generator. The drain probe is modified by placing the R2 resistor of 100 ohms in series, and a capacitor of 1 uF in parallel, on the probe tip to allow for current monitoring and voltage regulation, respectively. Separate probes (Kelvin modifications) are utilized for bias voltage and drain voltage measurements to eliminate errors from contact resistances. The resistors and capacitor are physically mounted on the probe tips to reduce frequency and cable length effects.

To compensate for any slight variations in voltage readings, the computer controller 10 is programmed to average the readings for Vdd and Vds prior to performing each calculation of the drain current Ids. Once Ids is calculated, Vds is increased automatically in computer-selected voltage steps matched to the oscilloscope offset and range for maximum resolution. The procedure is repeated until the drain bias Vds becomes greater than the maximum value selected by the user, typically about 4-5 V. This yields I-V data for the gate signal at one frequency.

Figure 4A:
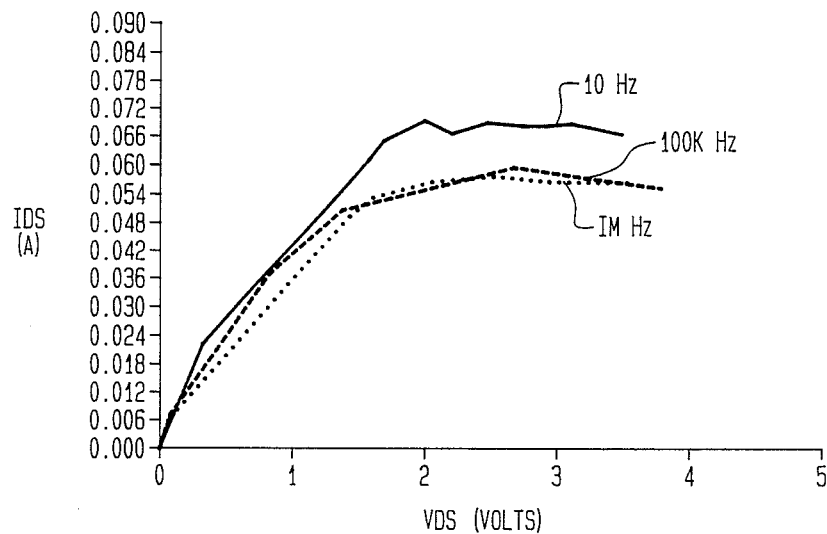
FIGS. 4a and 4b show sample charts for I-V and transconductance measurements for the GaAs MESFET device.

At this point, the function generator is adjusted to increase the frequency of the gate bias signal. As the frequency is increased, commands are sent automatically to the oscilloscope to compensate for changes in the time base display. After a number of measurements at different frequencies, e.g., 10 Hz, 100 KHz, and 1 MHz, the computer-compiled data is tabulated and a graph depicting Ids vs. Vds at each frequency is displayed, as shown, for example, in FIG. 4a, and also printed for evaluation.

The maximum drain current "Imax" is determined from Ids measurements which reach a saturation value when the drain voltage Vds is increased to between 2 and 3 volts. The Imax value is derived by the computer controller 10 for each step of gate signal frequency tested (see FIG. 3). The percentage drop in Imax between step changes in frequency N and M is also computed, as follows:

$$Imax\ drop\ (\%) = \frac{Imax(N\ Hz) - Imax(M\ Hz)}{Imax(N\ Hz)} \times 100\%$$

$$= \left(1 - \frac{Imax(M\ Hz)}{Imax(N\ Hz)}\right) \times 100\%$$

Figure 4B:
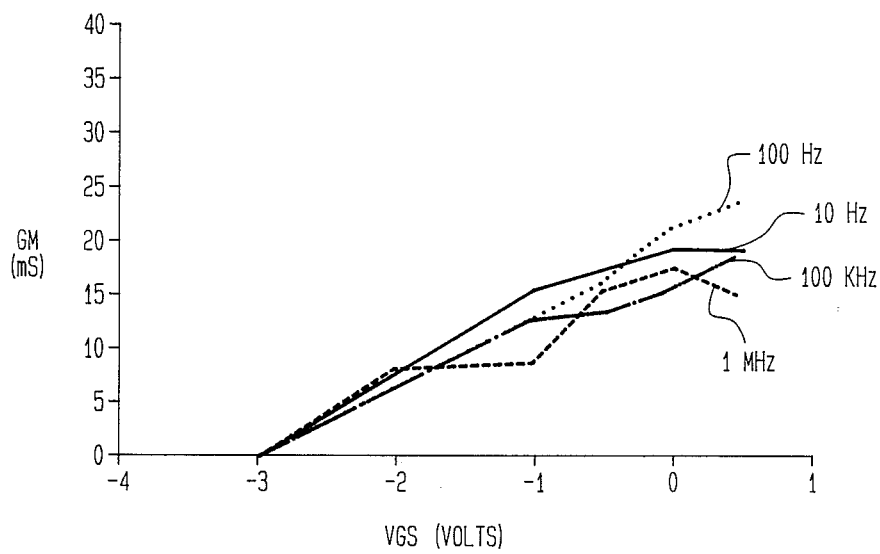

To determine the transconductance "gm" of the device, the I-V measurement is interrupted when Vds exceeds 2 volts. At that point, the gate bias signal is changed from sine wave to sawtooth wave in order to use a linearly changing gate voltage for the gm derivative calculation for the transconductance. Full, one-cycle transients for Vgs and Vds are captured and averaged 16 times by the oscilloscope. From this data, the transconductance is calculated at various ate bias voltages, e.g., −3, −2, −1, −0.5, 0, and 0.5 volts. FIG. 4b shows a typical graph of the calculated transconductance versus gate signal bias. Alternatively, the variation of transconductance with frequency may also be plotted.

COMPARISON OF VFIV TO STANDARD DC I-V CHARACTERISTICS

In order to assess the accuracy of variable-frequency current-voltage VFIV measurements taken in accordance with the invention, several comparison tests of standard DC I-V semiconductor parameters for the IC devices were performed on a Hewlett-Packard 4145B Semiconductor Parameter Analyzer. The HP 4145B was used to perform DC current measurements on both chips and wafers. The DC I-V measurements were compared to VFIV measurements at 10 Hz for the same lots of tested devices. The comparison results indicated a deviation of less than 2.5%, which was within the anticipated error of the VFIV system, and thus strongly supports the reliability of the VFIV measurements.

VFIV INVESTIGATION OF FREQUENCY DEPENDENT EFFECTS

The VFIV measurements taken in accordance with the invention are useful for investigating frequency dependent effects on power FET devices. Large gate voltage swings and frequency changes may influence the device surface states, surface potential, bulk trapping phenomena, and deep interface effects. To understand which of the possible phenomena might be reflected in the VFIV measurements of Ids and Imax, experiments were conducted using various device structures, gate voltage swings, and frequency steps.

Changes in VFIV Imax were compared to changes in gate minimum bias to examine whether a major cause of the VFIV Imax drop is a surface or a deep-level, active layer interface effect. Power FET devices constructed on epitaxial layers were measured under various gate minimum bias values. No changes in the measured Imax were observed for variations of the minimum bias ±1 volt from the specified pinchoff voltage. Overpinching the device by 2 volts or more did affect the measurement of Imax at high frequency because of severe distortion of the output signal. Underpinching by 2 volts had little effect on measured Imax. Since the variations in gate minimum bias had little effect on Imax, it can be concluded that for devices constructed on epitaxial layers, the major contributor to the frequency dispersion of Imax is not the result of deep level effects in the active layer interface region, but rather a surface effect. Deep level transient spectroscopy (DLTS) measurements on epitaxial layer devices have shown a very low, deep-level charge trapping density, which also supports this conclusion.

Another test compared VFIV Imax frequency dispersion of devices having multiple high energy implanted layers, in which a beryllium implant was used to sharpen the large tail of the deep implant, with standard epitaxial FETs. The two types of devices were nominally identical N+ on N, double recess power FETs fabricated using the same process steps but different starting materials. One wafer lot was VPE epitaxially grown, and the other was an ion implanted FET structure, both with nominally identical carrier profiles. Both lots used the same ledge and gate recess targets and were processed similarly. DC results showed equivalent Idss and Imax values. However, comparison of the VFIV data for the two lots showed that the 10 Hz Imax values were similar, but the Imax measured at 1 MHz of the implanted wafers had a large drop. The epitaxial devices had a small Imax drop of 14-30%, which was typical of most passivated C band device wafers, whereas the implanted devices had a much larger Imax drop of 43-58%. Since the two lots were processed similarly, they should have similar surface effects, and thus the additional Imax drop of the implanted lot may be attributed to the channel or bulk effect of the implant.

Figure 3:
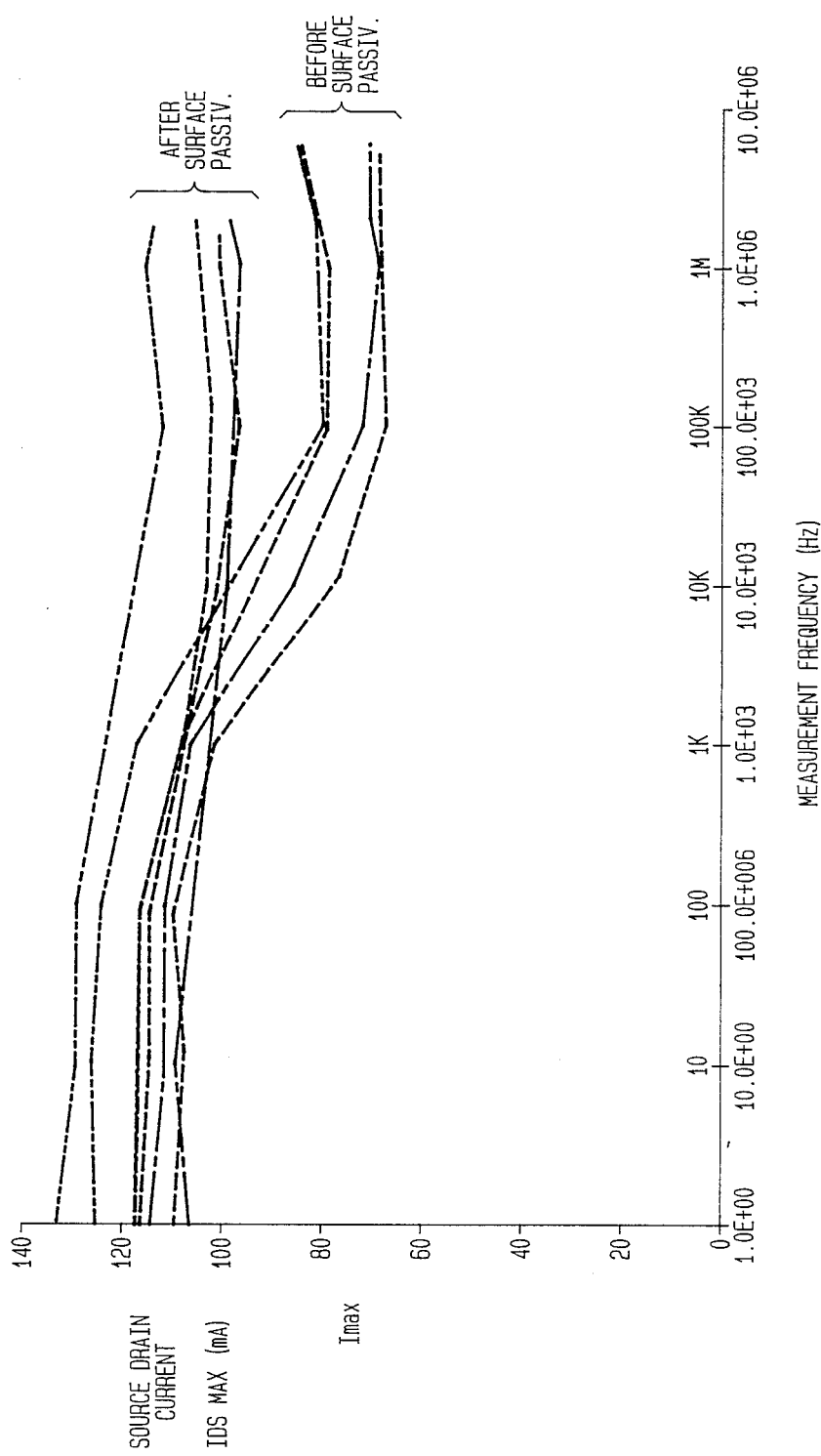
FIG. 3 is a graph showing the VFIV drain current (Imax) drop for the GaAs MESFET device measured over a frequency range of 1 Hz to 6 MHz.

In FIG. 3, the VFIV Imax measurements, for two sets of four wafers each, demonstrate a typical frequency dependence effect over the range of 1 Hz to 6 MHz in decade frequency steps. Generally, below 1 KHz and above 100 KHz, there is little variation in measured VFIV Imax. This implies that the time constants of frequency dispersion are in the general range of 10 usec to 10 msec, which is at the lower end of the time constant regime for deep level effects in GaAs FET devices. Thus, frequency dispersion due to a surface charge effect is indicated.

The two sets of VFIV Imax measurements in FIG. 3 represent those taken before and after a silicon nitride passivation layer was applied to the wafers. Prior to passivation, all wafers exhibited a large change in Imax at higher frequencies. After passivation, the Imax drop with frequency is very small, thereby confirming that frequency dispersion effects are reduced through surface passivation. The test in FIG. 3 was performed for self-aligned type devices, but the same effect was also observed with ledge type devices.

The observations that passivation reduces the frequency dispersion of VFIV Imax, that ledge type devices show more variation with frequency, and that changes in negative gate bias produce little change in VFIV Imax all indicate that the mechanism responsible for frequency dependence is a surface effect rather than an effect of the active layer-substrate interface. Changes in the surface state, surface defect population, or surface potential with frequency may therefore be observed as changes in VFIV Imax. Quick feedback on these surface conditions can be obtained early, e.g. one-third way, in the wafer fabrication process. Thus, the VFIV measurement system of the invention provides a valuable tool to test frequency-dependent device parameters, and to make surface process development comparisons, e.g., of surface treatment, passivation, plasma deposition, stripping, photo treatment, and annealing.

VFIV CORRELATION TO RF POWER PERFORMANCE

Single gate, FET test chips were tested to determine whether the VFIV measurements could be correlated with RF performance. The test chips used were backside-thinned and metallized FETs, with a gate area of $1 \times 350$ um, taken from wafers which were previously measured for RF performance characteristics. Test chips from 24 different wafers were measured, and included ledge and self-aligned type devices. FIG. 5 shows the variations of average RF power (in dBm), and FIG. 6 shows the variations in RF efficiency, as a function of percentage drop in Imax at 10 Hz and 1 MHz. Each point represents an average of the measurements made on the chips from one wafer.

In both figures, the data shows a strong correlation between drop in RF power and efficiency as a function of increased Imax drop. For Imax drops greater than 12–15%, a significant reduction in RF power is apparent. The data scatter for RF efficiency is larger, but the same general decrease in efficiency is observed for increasing Imax drop. No significant differences are noted between self-aligned and ledge type devices, except that self-aligned devices exhibited higher RF power and efficiency and, correspondingly, lower Imax drop.

Figure 8:
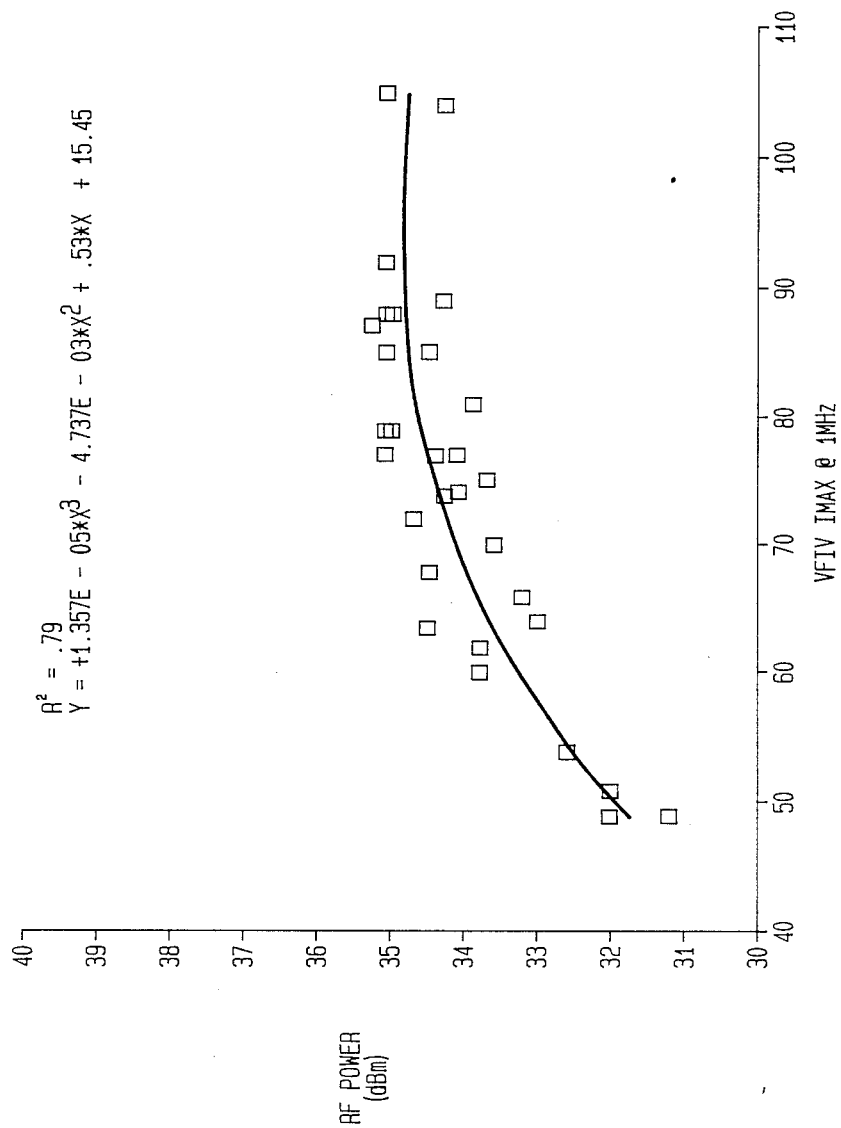
FIG. 8 is a scatter plot of average RF power for samples of the GaAs MESFET device at 1 MHz as a function of VFIV Imax.

Further correlations were examined and are illustrated in FIGS. 7–10. FIGS. 7 and 8 show that VFIV Imax measurements at 10 Hz and 1 MHz, respectively, appear to be good predictors of RF power. In each case, low measured values of VFIV Imax correlate to low power, while at higher values the power appears to reach saturation. In general, VFIV Imax measurements at 10 Hz showed that power did not increase for Imax above 75–85 mA (215–245 mA/mm), while for 1 MHz measurements this saturation occurs for Imax above 65–75 mA (185–215 mA/mm). This leads to the prediction that wafers with VFIV Imax measurements below these ranges will have decreased power output.

Figure 9:
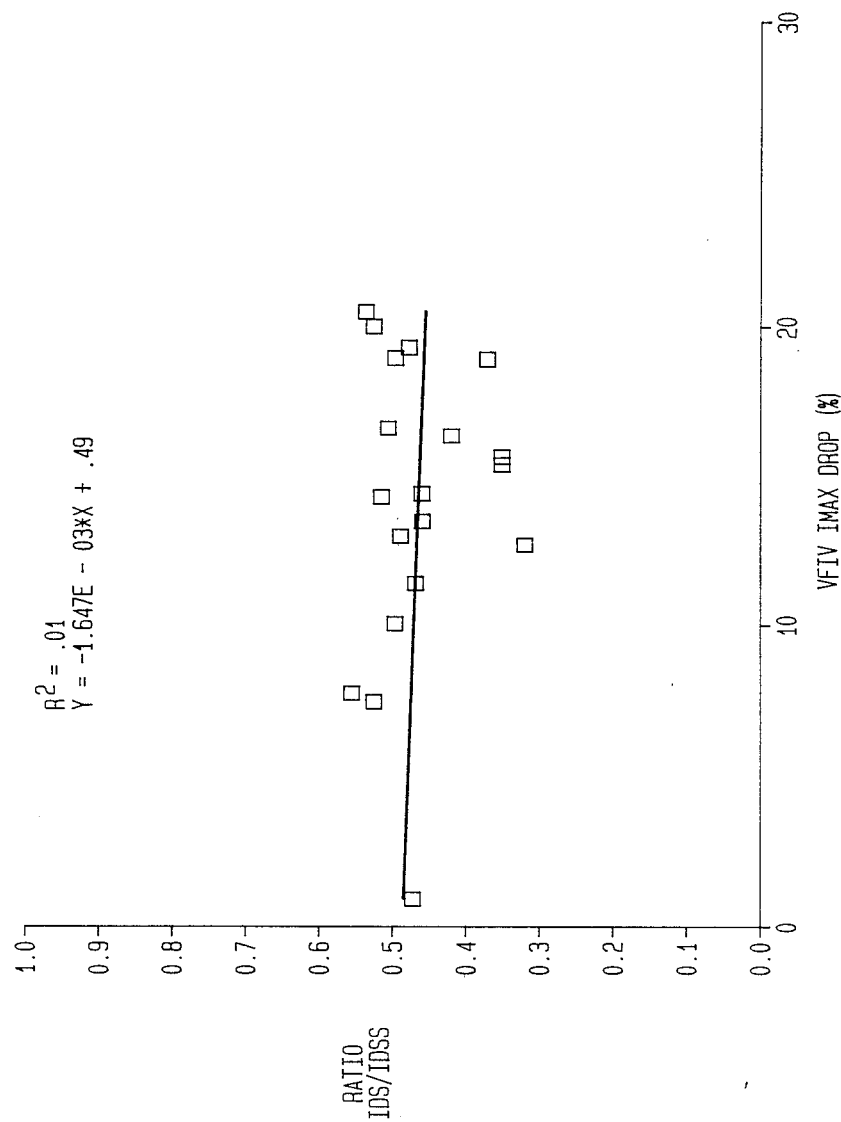
FIG. 9 is a scatter plot of the current linearity for samples of the GaAs MESFET device as a function of percentage VFIV Imax drop.

FIGS. 9 and 10 show the correlation between the RF performance parameter of the Ids/Idss ratio to VFIV Imax percentage drop and measurement, respectively. This RF performance parameter compares the operating Ids tuned for maximum power at 1 dB gain compression to the DC value of Idss, and is a measure of linearity in RF operations. FIG. 9 shows that a smaller VFIV Imax percentage drop occurs in wafers with a higher linearity ratio. Although the data scatter is large, the general trend of decreasing linearity with higher Imax drop is evident. Similarly, FIG. 10 shows a general trend of increasing linearity ratio with increasing VFIV Imax measurements at 1 MHz.

Although not shown in the figures, other comparisons of VFIV data indicated that wafers with an Imax drop of greater than 25% showed significantly reduced Ids/Idss ratio. Also, VFIV Imax measurements at 1 MHz indicated that Imax must be above 70 or 75 mA (200–215 mA/mm) for the wafer to be capable of 3 watt power performance, and those below this level showed reduced power output. Similar relationships hold for comparisons of Imax measurements at 10 Hz.

In summary, an automated variable-frequency current-voltage measurement system and related test methods are provided in the invention. The system is shown to be capable of accurately repeating all standard DC FET measurements as a function of frequency and gate signal voltage. Measurements made on wafers of VFIV Imax percentage drop and measured values show good correlation with RF power performance, and somewhat lesser correlation with efficiency and linearity. Thus, the system provides predictive testing of IC devices while in wafer form to select good wafers and avoid the time-consuming process of finishing, backside processing, packaging, and RF testing of nonconforming wafers. The system can also be used to investigate frequency dependent effects of IC devices in wafer form or on test chips, and as a process development tool to obtain quick feedback on fabrication processes.

The specific embodiments and modes of the invention described herein are intended to be illustrative only, and many other variations and modifications may be made thereto in accordance with the principles of the invention. All such embodiments and variations and modifications thereof are considered to be included within the scope of the invention, as defined in the following claims.

We claim:

1. A variable-frequency I-V measurement system, for testing an IC device having source, drain, and gate terminals, comprising:
   a DC power supply for providing a bias voltage across the drain and source terminals of the IC device;
   measuring means for measuring at least a voltage developed at, and a current flowing through, the drain terminal in response to an input gate signal applied to the gate terminal, wherein the voltage and current measured by said measuring means represent an I-V characteristic of the IC device;
   a gate signal source for providing an input gate signal having a variable frequency to the gate terminal; and
   controller means for controlling said gate signal source to provide separately, in sequence, at least two input gate signals of different frequencies in a selected range of frequencies, for operating said measuring means to measure the I-V characteristics of the device in response to each of the two input gate signals, and for deriving a variable-frequency I-V (VFIV) value from the measured I-V characteristics of the device for each of the at least two input gate signals.

2. The measurement system according to claim 1, further comprising digital display means for displaying the measured I-V characteristics and derived VFIV values.

3. The measurement system according to claim 1, wherein said measuring means includes a gate probe for measuring a gate voltage at the gate terminal of the IC device, said gate probe including an impedance-matching resistor provided on its probe tip.

4. The measurement system according to claim 1, wherein said measuring means includes a current-monitoring resistor connected in series between said DC power supply and the drain terminal of the IC device for measuring a drain current through the difference between the bias voltage and the voltage developed at the drain terminal across said resistor.

5. The measurement system according to claim 4, wherein said measuring means further includes separate bias voltage and drain probes for measuring the bias voltage and the drain voltage, respectively, said drain probe including said current-monitoring resistor provided on its probe tip.

6. The measurement system according to claim 1, wherein said gate signal source generates sine waves and sawtooth waves of variable frequency under control of said controller means.

7. A method for testing an IC device having source, drain, and gate terminals, comprising the steps of:
applying a bias voltage across the drain and source terminals of the IC device;
measuring at least a voltage developed at, and a current flowing through, the drain terminal in response to an input gate signal applied to the gate terminal, wherein the voltage and current measured represent an I-V characteristic of the IC device;
providing an input gate signal having a variable frequency to the gate terminal;
controlling said input gate signal to provide separately, in sequence, at least two input gate signals of different frequencies in a selected range of frequencies, in order to measure the I-V characteristics of the device in response to each of the two input gate signals; and
deriving a variable-frequency I-V (VFIV) value from the measured I-V characteristics of the device for each of the at least two input gate signals.

8. The method according to claim 7, further comprising the step of comparing whether or not the derived VFIV values for the two or more gate signal frequencies meets a predetermined threshold level, said threshold level being selected to predict whether or not the IC device is likely to provide a selected performance characteristic.

9. The method according to claim 8, wherein said controlling step includes controlling the gate signal voltage to increase in incremental steps, and the derived VFIV value is a measurement of the maximum drain current (Imax) obtained as the gate signal voltage is increased in incremental steps.

10. The method according to claim 9, wherein said derived VFIV value further includes a percentage drop between the Imax value at one gate signal frequency compared to the Imax value at another gate signal frequency.

11. The method according to claim 10, as applied to a C-band GaAs MESFET device, wherein said selected two gate signal frequencies are 10 Hz and 1 MHz.

12. The method according to claim 9, wherein said comparing step includes comparing the measured Imax values to an Imax threshold value in order to predict whether the device will have good RF power characteristics.

13. The method according to claim 10, wherein said comparing step includes comparing the percentage Imax drop between two gate signal frequencies to a percentage threshold value in order to predict whether the device will have good RF power characteristics.

14. The method according to claim 13, wherein said percentage threshold value is about 12-15%, and the predicted RF power characteristic is an RF power output of about 3 watts or more.

15. The method according to claim 13, wherein said percentage threshold value is about 12-15%, and the predicted RF power characteristic is RF efficiency.

16. The method according to claim 12, wherein said Imax threshold value is about 75-85 mA, and the predicted RF power characteristic is RF power output.

17. The method according to claim 12, wherein the predicted RF power characteristic is RF output linearity.

18. The method according to claim 7, further comprising the step of comparing the derived VFIV values for the two or more gate signal frequencies for devices in wafer form developed using different process conditions.

19. The method according to claim 7, further comprising the step of comparing the derived VFIV values for the two or more gate signal frequencies for devices having different surface characteristics in order to predict a frequency dispersion response of a tested device.

20. A computerized variable-frequency I-V measurement system, for testing an IC device having source, drain, and gate terminals, comprising:
a DC power supply for providing a bias voltage across the drain and source terminals of the IC device;
measuring means including a bias voltage probe for measuring the bias voltage applied to the IC device, a drain probe for measuring a voltage developed at the drain terminal, a resistor connected in series between the bias voltage and the drain voltage for monitoring a drain current, and a gate probe for measuring a gate voltage of an input gate signal applied to the gate terminal, wherein the drain voltage, drain current, and gate signal voltage measured by said measuring means represent an I-V characteristic of the IC device;
a gate signal source for providing an input gate signal having a variable frequency to the gate terminal; and
a computer controller, connected to said measuring means and said gate signal source, for controlling said gate signal source to provide separately, in sequence, at least two input gate signals of different frequencies in a selected range of frequencies, for operating said measuring means to measure the I-V characteristics of the device in response to each of the two input gate signals, and for deriving a variable-frequency I-V (VFIV) value from the measured I-V characteristics of the device for each of the at least two input gate signals.

* * * * *